(12) United States Patent
Shiga et al.

(10) Patent No.: US 6,937,524 B2
(45) Date of Patent: Aug. 30, 2005

(54) NONVOLATILE SEMICONDUCTOR MEMORY DEVICE HAVING A WRITE CONTROL CIRCUIT

(75) Inventors: Hitoshi Shiga, Yokohama (JP); Naoya Tokiwa, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 151 days.

(21) Appl. No.: 10/461,995

(22) Filed: Jun. 11, 2003

(65) Prior Publication Data

US 2004/0027901 A1 Feb. 12, 2004

(30) Foreign Application Priority Data

Jun. 18, 2002 (JP) ........................................ 2002-177553

(51) Int. Cl.[7] .............................................. G11C 16/04
(52) U.S. Cl. .............................. 365/185.3; 365/185.29; 365/185.22
(58) Field of Search ......................... 365/185.3, 185.29, 365/185.22

(56) References Cited

U.S. PATENT DOCUMENTS 5,680,347 A * 10/1997 Takeuchi et al. ....... 365/185.17
5,781,478 A    7/1998 Takeuchi et al.
5,793,696 A * 8/1998 Tanaka et al. ......... 365/230.06

FOREIGN PATENT DOCUMENTS

| JP | 09-198882 | 7/1997 |
| JP | 2000-163976 | 6/2000 |

* cited by examiner

Primary Examiner—Connie C. Yoha
(74) Attorney, Agent, or Firm—Hogan & Hartson, LLP

(57) ABSTRACT

A non-volatile semiconductor memory device capable of performing page programming at high speeds is provided. This nonvolatile memory device includes a cell array with a matrix of rows and columns of electrically writable and erasable nonvolatile memory cells, and a write control circuit which writes or "programs" one-page data into this cell array at a plurality of addresses within one page. The write control circuit is operable to iteratively perform iteration of a write operation for the plurality of addresses corresponding to one page and iteration of a verify-read operation of the plurality of addresses after writing until verify-read check is passed with respect to every address involved. Regarding an address or addresses with no cells to be written any more, the write control circuit skips the write operation and the after-write verify-read operation.

13 Claims, 15 Drawing Sheets

NONVOLATILE SEMICONDUCTOR MEMORY DEVICE HAVING A WRITE CONTROL CIRCUIT

CROSS-REFERENCE TO PRIOR APPLICATION

This application is based upon and claims the benefit of priority from the prior Japanese Patent Application No. 2002-177553, filed on Jun. 18, 2002, the entire contents of which are incorporated herein by reference.

BACKGROUND OF THE INVENTION

1. Field of the Invention

This invention relates to electrically writable and erasable nonvolatile semiconductor memory devices, including electrically erasable programmable read only memory (EEPROM) devices. More particularly but not exclusively, the invention relates to write schemes of nonvolatile semiconductor memory devices utilizing write techniques based on "hot" electron injection.

2. Description of the Related Art

Flash EEPROM devices include flash memories of the so-called NOR type, which are designed to make use of write schemes based on injection of hot electrons. See FIG. 16. This diagram shows typical bias conditions during writing of a memory cell MC in a NOR-flash memory chip. This memory cell MC has a stacked gate transistor structure, including a floating gate 103 and a control gate 105 above a silicon substrate 100. The floating gate 103 is formed above a p-type semiconductor well region 101 in the silicon substrate 100, with a tunneling dielectric film 102 being interposed between the well 101 and floating gate 103. The control gate 105 is formed to overlie this floating gate 103 with an interlayer dielectric film 104 therebetween. This film 104 is called the "inter-gate" insulator film. Source 106 and drain 107 are formed so that these are self-aligned with control gate 105. Control gate 105 is connected to a corresponding one of word lines, while drain 107 is coupled to a corresponding one of bit lines through a column gate. Source 106 is coupled to a common source line.

During data writing, as shown in FIG. 16, apply a write voltage of 10 volts (V) to the control gate 105 and apply the drain 107 with either a voltage of 5V (in the case of logic "0" data) or a low level power source voltage Vss (in the case of logic "1" data) while letting the p-type well 101 and source 106 be set at 0V. With such voltage application, the memory cell MC turns on permitting flow of a large drain current (write current) Iprg at the time of logic "0" data write. This current flow results in production of hot electrons. These hot electrons are injected to the floating gate 103 by the presence of a high electric field between the control gate and the channel, and are then trapped at floating gate 103.

A high threshold voltage state with electrons trapped at the floating gate 103 is regarded as data "0" storage (write state), by way of example. Data erase is performed in a way which follows. Apply an erase voltage, which has its polarity that causes p-well 101 to become positive, between the control gate 105 and p-well 101 to thereby force the electrons of floating gate 103 to draw out toward the channel side in the form of a Fowler-Nordheim (FN) tunneling current. This results in establishment of a low threshold voltage state with the electrons drawn out of floating gate 103, which is regarded as data "1" storage (erase state).

A high level power source voltage to be used during data writing and erasing is produced by potential boosting circuitry employing charge pump architectures. The booster circuitry includes a part that gives the drain voltage during writing. This part is required to offer large current supplying capability for production of hot electrons in the way stated above. Unfortunately, presently available standard charge pump circuits are less in current supplying ability. Accordingly, with prior known write schemes using hot electron injection, a number of data bits (cell number) capable of being written simultaneously is determined by the current supply ability of such booster circuit part for giving the drain voltage. Generally the simultaneous writable data bits are limited in number to four (4) to sixteen (16) bits.

Consequently, one typical approach to achieving the so-called "page program" functionality that automatically performs writing of a page of data bits (for example, 64 bits) is as follows. While loading a page of data bits together from the outside of a chip, within-the-page or "intra-page" access is done inside the chip to thereby permit execution of data write for a column of addresses (e.g. 8 bits) at a time. This per-column write technique will be explained in detail below.

FIG. 17 is a basic flow chart of a procedure of one typical automated write function that is often employed in flash memory chips. The term "automated write" as used herein may refer to a function that performs write and verify operations while a chip per se automatically controls internal voltage potentials and sense amplifiers after receipt of a write command along with a write address and write data. After having received and accepted the write command and write address/data, the procedure goes to step S1 which determines whether the chip is presently in a write inhibition (protect) state. If the answer is NO at step S1, that is, when the chip is not in the protect state, then the procedure goes to step S2 which performs write set-up. Next, proceed to step S3 which executes writing. After completion of writing, go to step S4 for verify setup and then go to step S5 that performs verify-read to thereby determine whether desired data was written successfully.

At the verify-check step S5, detection is done on a per-bit basis to determine whether the data bit to be written and the actually written data are identical to each other. If all the bits involved do not pass the test, i.e. if NO at step S5, then the procedure goes next to step S6 which determines the next write data, followed by repeated execution of write and verify operations. Note here that the language "determine[s] the write data" means an operation which appropriately controls write data transmission so that the write voltage is no longer applied in the next cycle to the drain of a certain memory cell in which a logic "0" data bit has already been written.

FIG. 18 shows potential changes of a word line WL and a bit line BL in such auto-write process flow of FIG. 17. The write and verify-read setup sessions (at steps S2 and S4) are mainly a wait time taken for the write voltage being applied to wordline WL to become stable in potential. In most cases the write and verify-read require consumption of a time which is almost equal in length to a write time period, although the time length is variable depending upon the performance of power supply control circuitry.

In the process flow of FIG. 17, only a write event is shown with respect to any given one address. Recall that the page write or "program" operation is for inputting and latching a series of continuous data bits corresponding to multiple addresses upon inputting of a write command and then automatically performing writing with respect to all of them in a similar way. In the case of this page programming, the flow of a write process is as shown in FIG. 19. This is a scheme for performing a write/verify process loop on a per-address basis.

For the first address, perform write/verify in a similar way to the flow of FIG. 17 and repeat writing until the verify test is passed. When the verify is passed at step S5, the procedure goes to step S7 which determines whether a present address is the final address. If NO at step S7, then proceed to step S8 which increases or "counts up" a present address by one, followed by execution of similar write/verify operations. This write/verify cycle will be repeated with respect to every address within a page until write passes the verify test.

The relevant art page program sequence shown in FIG. 19 is faced with a problem that write setup is required per address, resulting in an unwanted increase in length of a time taken to complete the page programming.

This invention has been made in view of the technical background stated above, and an object of the invention is to provide a nonvolatile semiconductor memory device capable of performing page programming at high speeds.

SUMMARY OF THE INVENTION

A nonvolatile semiconductor memory device in accordance with this invention includes a cell array with a layout of electrically writable and erasable nonvolatile memory cells and a write control circuit configured to write one-page data into the cell array at a plurality of addresses within the page. The write control circuit is operable to repeatedly perform iteration of a write operation for the plurality of addresses corresponding to a page and iteration of a verify-read operation for the plurality of address after writing until verify-read check is passed with respect to all the addresses. As for an address or addresses with no cells to be written, the write control circuit skips the write operation and the after-write verify-read operation.

DETAILED DESCRIPTION OF THE EMBODIMENTS

Embodiments of this invention will be explained with reference to the accompanying drawings below.

Figure 6:
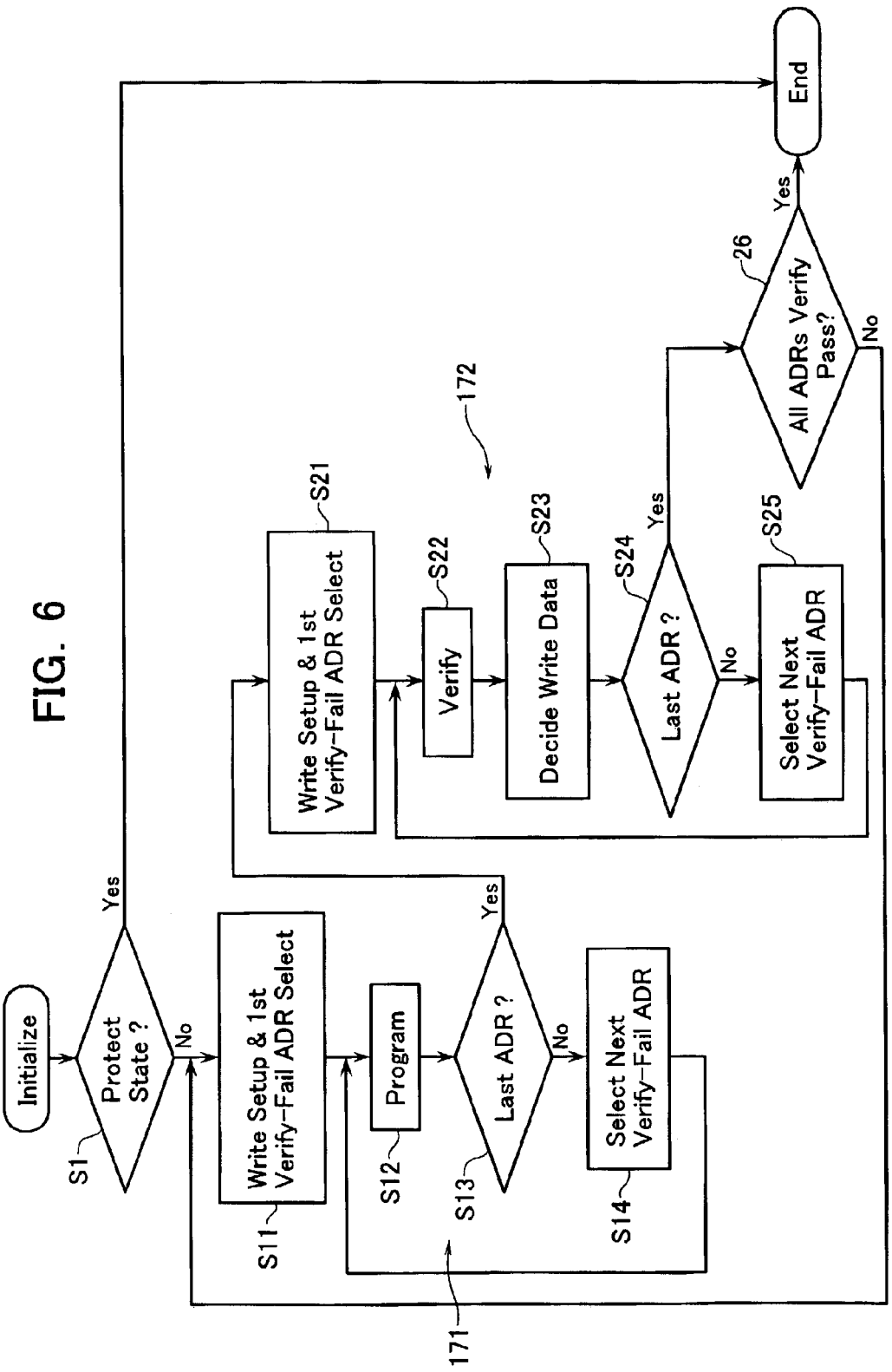
FIG. 6 is a diagram showing the flow of a page programming procedure of the embodiment.

Referring to FIG. 6, there is shown a control sequence for page programming procedure of a flash memory device of the NOR type in accordance with an embodiment of the invention. Principally in this embodiment, the procedure includes a write sequence loop 171 and a verify sequence loop 172. The write loop 171 is for updating an address and for repeating a write operation only, whereas the verify loop 172 is for updating an address and cycling only a verify-read operation. Note however that the address update in each loop 171, 172 is not mere address increment but is specifically designed to refer to a result of pass/fail testing of verify-read check per address and then skip an address that has passed the verify-read check test—say, "passed" address.

More specifically, the write sequence loop 171 starts with step S11 which performs write set-up and selection of an address that failed its verify check test—namely, "failed" address. Then, the routine goes to step S12 which performs writing. At step S13, determine whether a present address is the final address within a page. If NO at step S13 then go to step S14 which selects the next address that does not yet pass the verify-read check. Subsequently, return to step S12 which performs writing to such address. Thereafter, when writing is completed at all the addresses within the page of interest, the routine proceeds to the verify sequence loop 172.

The verify sequence loop 172 starts with step S21 which performs verify setup and also performs selection of a "failed" address, whose verify check result is "Fail". At step S22, perform a verify-read operation. At step S23, determine the next write data in a way pursuant to a result of the verify-read thereof. In step S24, inquire if a present address reaches the final address. If NO at step S24 then go to step S25 which selects the next "failed" address. Then return to step S22, which performs similar verify-reading with respect to such address. This cycle of operations will be repeated until a present address reaches the final address within the page. Thereafter, if YES at step S24 then go to step S26 which determines whether the verify result of every address is "Pass" or "Fail." If NO at step S26, i.e., when even one address is "Fail," then return to the write sequence loop 171 and again execute similar write/verify operations until every address is flagged with "Pass"—in other words, all the addresses within the page are found to pass the read-verify testing.

Figure 17:
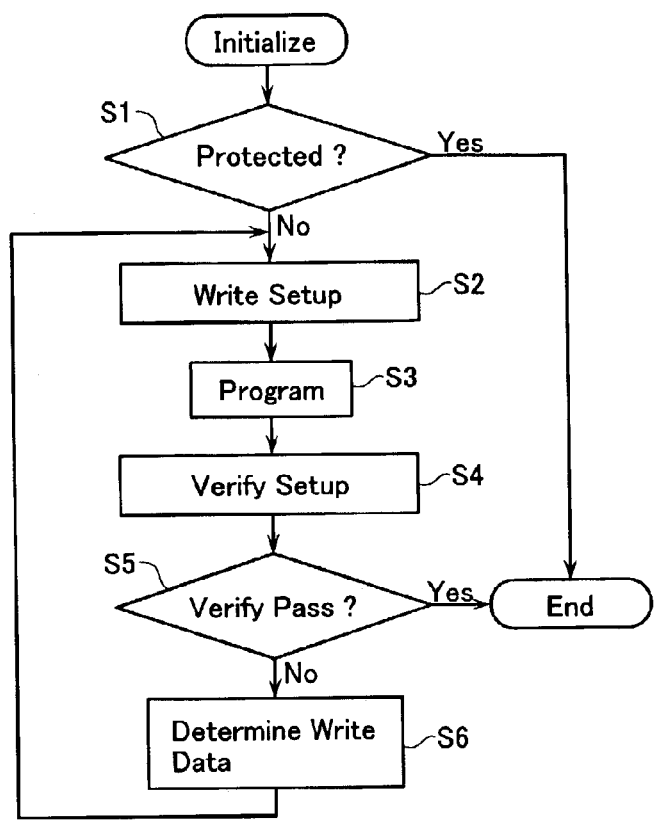
FIG. 17 is a diagram showing a basic sequence of one known write scheme.
Figure 18:
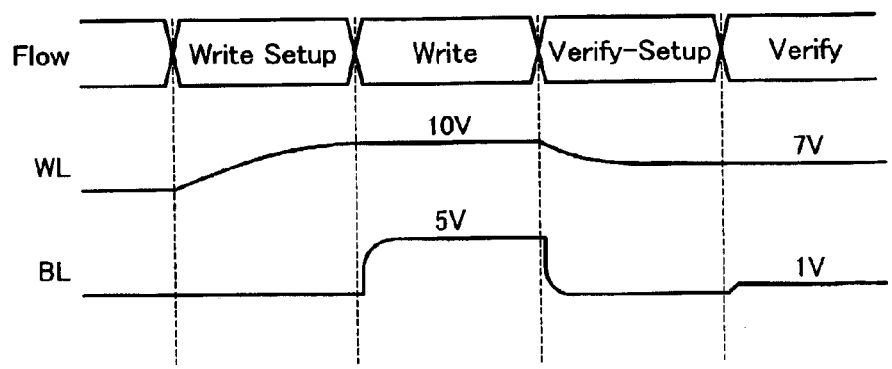
FIG. 18 is a diagram showing potential changes of a word line and a bit line during write and verify-read operations.
Figure 19:
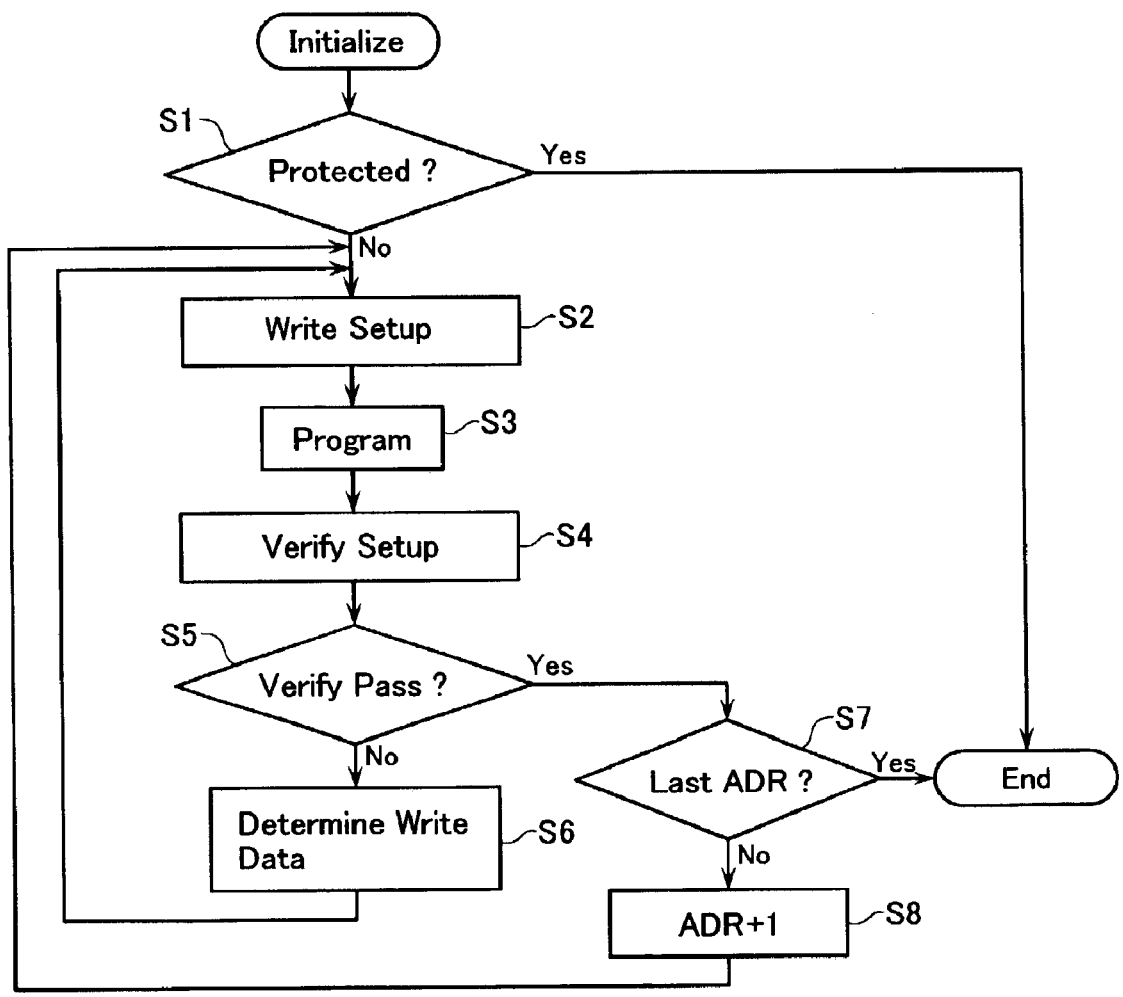
FIG. 19 is a diagram showing a page write sequence in the relevant art.

With execution of the page programming routine with the sequence stated above, it is possible to reduce in number the write/verify setup events when compared to the sequence of the relevant art shown in FIG. 17. This can be said for the reason which follows. While in the sequence of FIG. 17 the setup is required for the individual one of write and verify-read events once at a time whenever an address is updated, the embodiment of FIG. 6 does no longer require such setup per address update due to the fact that writing is continuously executed with respect to all the addresses and verify-read is continuously done for all addresses in a similar way. Accordingly this sequence becomes effective when the setup process takes an increased length of time.

Another important feature of the embodiment procedure of FIG. 6 is as follows. In each of the write/verify sequence loops 171–172, all the addresses within a page will not simply be subjected to selection and execution; on the contrary, write/verify operations are selectively performed with respect to "failed" addresses only while skipping any "passed" address with its verify check result of "Pass." More specifically the write loop 171 of FIG. 6 includes step S11 which identifies and selects a first address with its verify check result of "Fail"—i.e., first verify check-"failed" address—and step S14 which is not a simple address update step but a step that skips any verify check-"passed" address and then selects the next failed address. Similarly the verify sequence 172 is as follows: at step S21, select a first verify check-failed address; at step S25, skip any verify check-passed address and select the next failed address.

Assume that the write/verify is simply executed with respect to all addresses in each sequence loop 171, 172. In this case, suppose that write is slow, for example, only at a certain address within one page, and thus write/verify-read cycle must be repeated again and again. If this is the case, the write/verify-read operations are to be performed for unnecessary addresses also. This would result in an unwanted increase in length of time required therefor. Fortunately in this embodiment, skipping the already "passed" addresses eliminates any waste write/verify time consumption, thereby making it possible to execute the page programming at a high speed.

Figure 1:
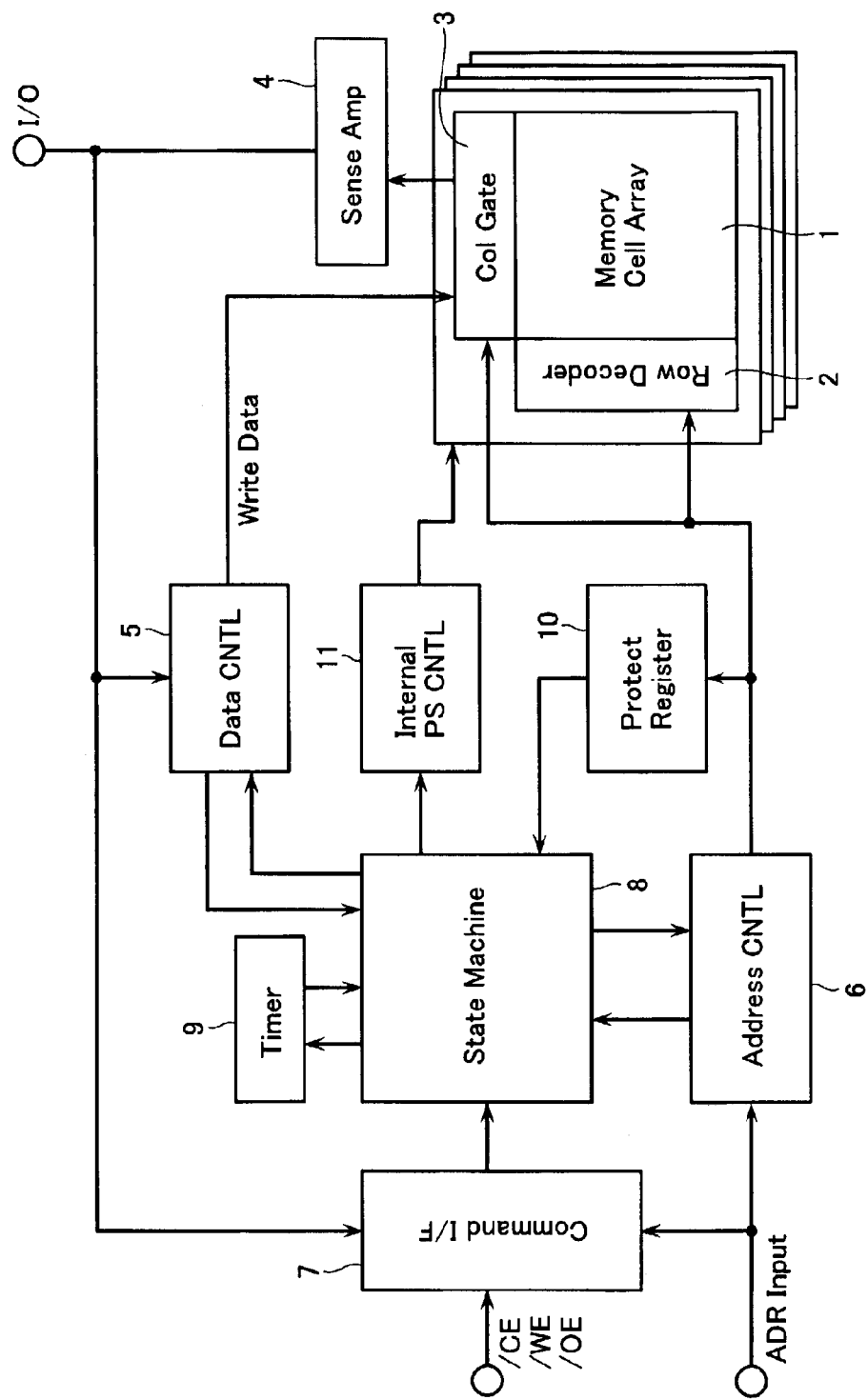
FIG. 1 is a diagram showing a configuration of a flash memory in accordance with an embodiment of this invention.

FIG. 1 is a block diagram of internal circuitry of a flash memory chip with page program control functionality for achievement of the page write process flow stated above. A command interface unit 7 is arranged to receive control signals, such as a chip enable signal CE(Bar) or "/CE," a write enable signal /WE and an output enable signal /OE or the like, and also receive a command to be supplied along with a data signal incoming from a data terminal I/O and an address signal from an address terminal. After having decoded this command, the interface 7 sends to a state machine 8 a trigger signal which permits startup of the sequence required.

The state machine 8 is operable to determine whether an address being presently input is in a protect state while comparing it to the value of a protect register 10 and then perform, if executable, the sequence control of an automated write or erase operation while changing output signals of an address control circuit 6 and a data control circuit 5 plus an internal power supply control circuit 11.

A memory cell array 1 is configured from a plurality of blocks serving as erase blocks, each of which is a unit where erase bias voltage is applied simultaneously.

Typically the erase block is definable as a range of specified memory cells commonly sharing a p-type semiconductor well layer. A row decoder 2 is provided for selecting one from among word lines of the memory cell array 1. A column gate 3 is provided to select one from bit lines thereof. Cell data will be sent forth toward a sense amplifier 4 and then output. A timer circuit 9 is rendered operative for control of the exact length of a bias application time period for write, erase or verify process in units of respective sequences.

Figure 2:
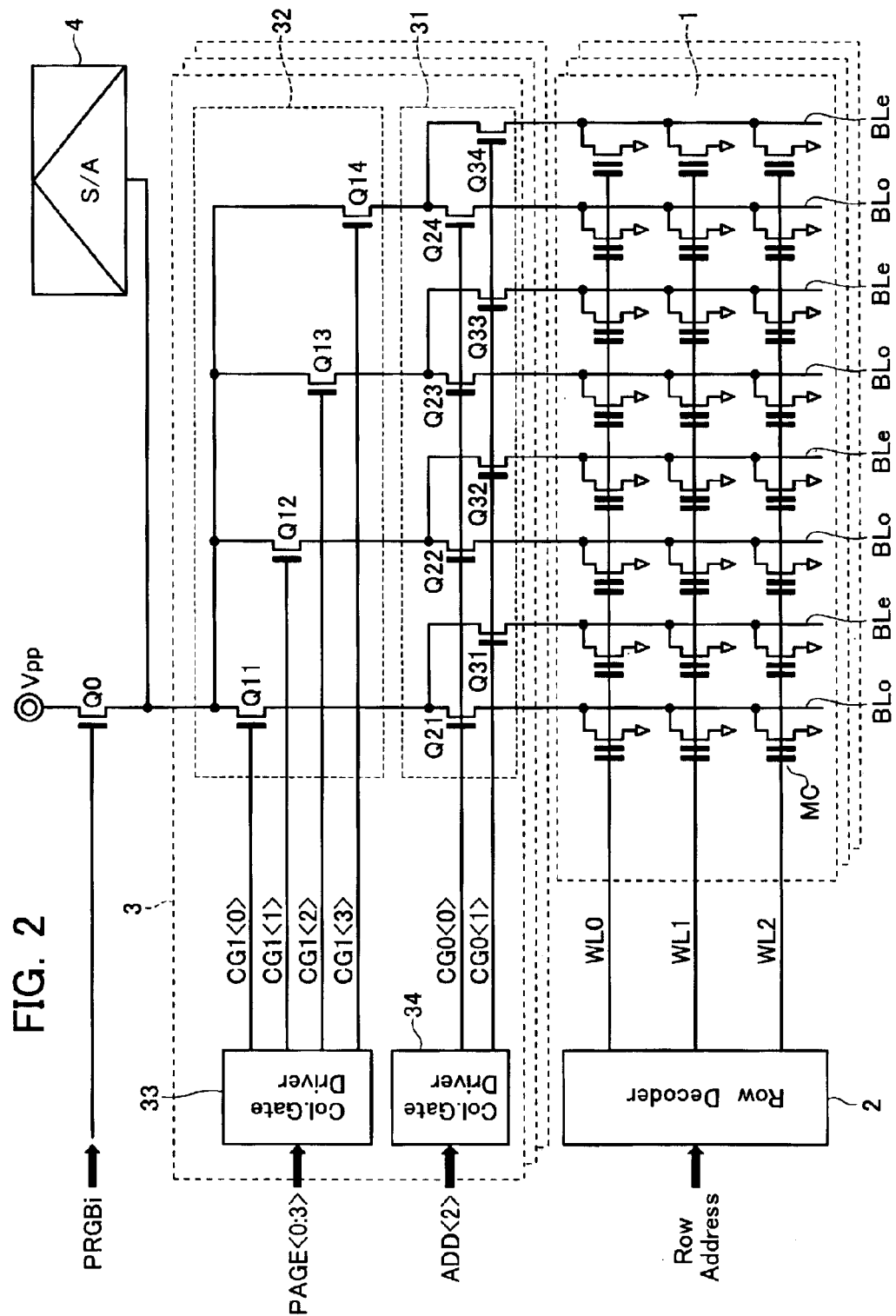
FIG. 2 is a diagram showing a configuration of circuitry including a cell array and a column gate unit of the flash memory.
Figure 16:
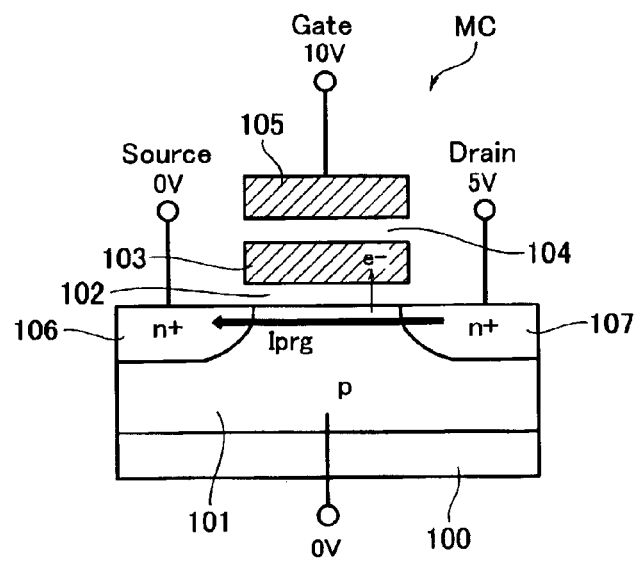
FIG. 16 is a diagram showing the bias state of a cell of a NOR-type flash memory during writing.

FIG. 2 shows a detailed circuit configuration of part including the memory cell array 1 and the column gate 3 of FIG. 1. The memory array 1 is arranged so that bit lines BL and word lines WL are disposed to cross together to thereby define therebetween cross-points, at which memory cells MC are laid out respectively. Each memory cell MC is structured as shown in FIG. 16. In this example the bit lines BL are constituted from odd-numbered bit lines BLo and even-numbered bitlines BLe. The column gate 3 is arranged to have a "two-stage tree" configuration, which includes a combination of two stages of column gate units 31 and 32. The column gate 31 is operable to select an odd-numbered bitline BLo and an even-numbered bitline BLe. The other column gate 32 is to further select one from these selected bitlines.

A column gate driver 33 is connected to receive a signal PAGE<0:3> obtained by decoding lower two bits of a column address, for generating and outputting a column select signal CG1<0:3> used to control the column gate unit 32. A column gate driver 34 receives a signal ADD<2> with an upper one bit decoded, for outputting a column select signal CG0<0:1> for control of the column gate unit 31.

Letting a page length of page programming be equivalent to four (4) addresses, column select signals CG1<0:3> are sequentially activated for four addresses within a single page. More specifically, the intended page program is achievable by performing address control in such a way as to sequentially activate the column select signal CG1 while at the same time fixing a row address for word-line selection and also fixing the column select signal CG0 for odd/even-numbered bitline selection. It should be noted here that although FIG. 2 shows only 1-bit bitline ranges which are selected respectively by four column select signals CG1<0> to CG1<3> that correspond to four addresses within a page, actually implemented circuitry is designed so that a plurality of bits (e.g., 8 bits) are simultaneously selected with respect to a single address.

At the time of data writing, write data PRGBi being output from a data control circuit 5 shown in FIG. 1 becomes at "High" or "H" level when the data to be written is a logic "0." The internal power supply control circuit 11 of FIG. 1 generates at its output a potentially raised or "boosted" high level power source voltage Vpp. This voltage Vpp is then supplied to a bit line being presently selected by the column gate 3 via a metal oxide semiconductor (MOS) transistor Q0, which is driven to turn on when the write data PRGBi is at "H" level (PRGBi=H). This is for use as a data voltage which is applied to the drain of a memory cell MC as shown in FIG. 16. In the case of logic "1" data write, the write data PRGBi is potentially set at "Low" or "L" level (PRGBi=L). Alternatively, during verify-read and standard or "normal" read operations, every write data PRGBi is at "L" level causing a presently selected bitline to be connected to the sense amplifier 4 for execution of a data sensing operation.

The data control circuit 5 of FIG. 1 is operable at the time of page programming to receive one-page data bits as loaded thereinto and then retain the page data therein until termination of a write session. Then in data control circuit 5, verify-read is done. When the result of this verify-read indicates that verify-read data is a logic "0" with respect to the data "0" to be written, the data control circuit 5 generates at its output a verify check flag indicative of "Pass." Simultaneously this controller 5 ensures that data transfer is controlled thereafter in such a way as to output write data PRGBi=H (that is, prevent application of the write voltage to the cell drain) even when the data being presently stored is "0."

Figure 3:
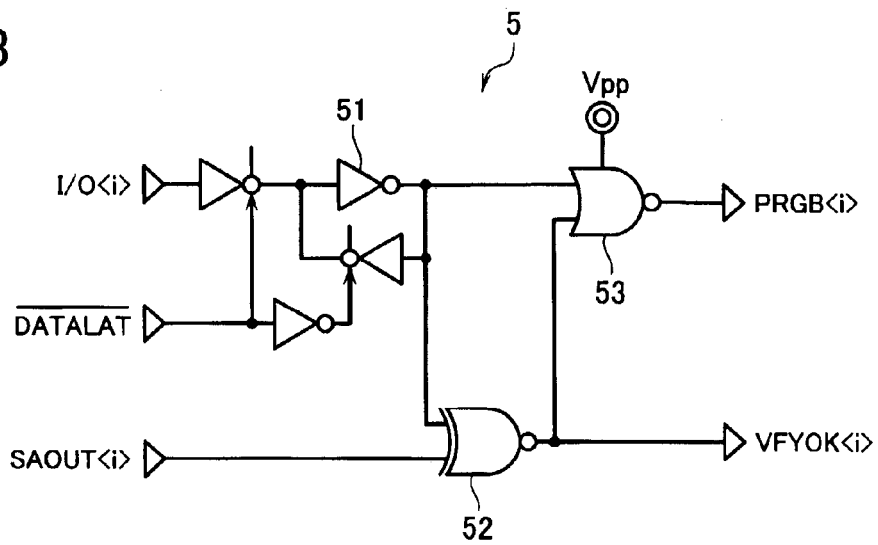
FIG. 3 is a diagram showing a configuration of a data control circuit of the flash memory.

FIG. 3 depicts a configuration of 1-bit data part of the data control circuit 5 that performs such the transfer control stated above. A data latch 51 is provided to store therein write data as supplied from an input/output (I/O) terminal. A NOR gate 53 is for use as a transfer control gate of the data being stored in the data latch 51. When this NOR gate is active, PRGBi=H is output if the write data is a logic "0" (i.e. the latch data is at "L" level); alternatively, if the write data is a logic "1" (latch data is at "H") then PRGBi=L is output therefrom. The output signal of NOR gate 53 is used to control turn-on and off of the transistor Q0 shown in FIG. 2 so that a high level power source voltage Vpp of 5 volts (Vpp=5V) is applied to the drain of a "0" write cell. At this time the voltage Vpp is not applied to the drain of a "1" write cell; instead, a low level source voltage Vss typically at ground potential is given thereto.

An exclusive NOR or "Ex-NOR" gate 52 in FIG. 3 is a verify-check gate that performs comparison of a sense amplifier output SAOUT<i> and the data stored in the data latch 51. When a result of verify-read indicates that the write data is identical to the sense amp output, "Pass" is flagged to such bit. At this time Ex-NOR gate 52 outputs a verify check signal VFYOK<i> that is potentially at "H" level (VFYOK<i>=H). This verify check output signal VFYOK<i> is also for use as an activation signal of NOR gate circuit 53. More specifically, when VFYOK<i>=H, NOR gate 53 is made inactive, forcing the write data PRGBi to be set at "L" (PRGBi=L) thereafter without regard to the stored data of latch 51. When VFYOK<i>=H is established for every bit, writing to such address is interpreted to be completed.

Figure 4:
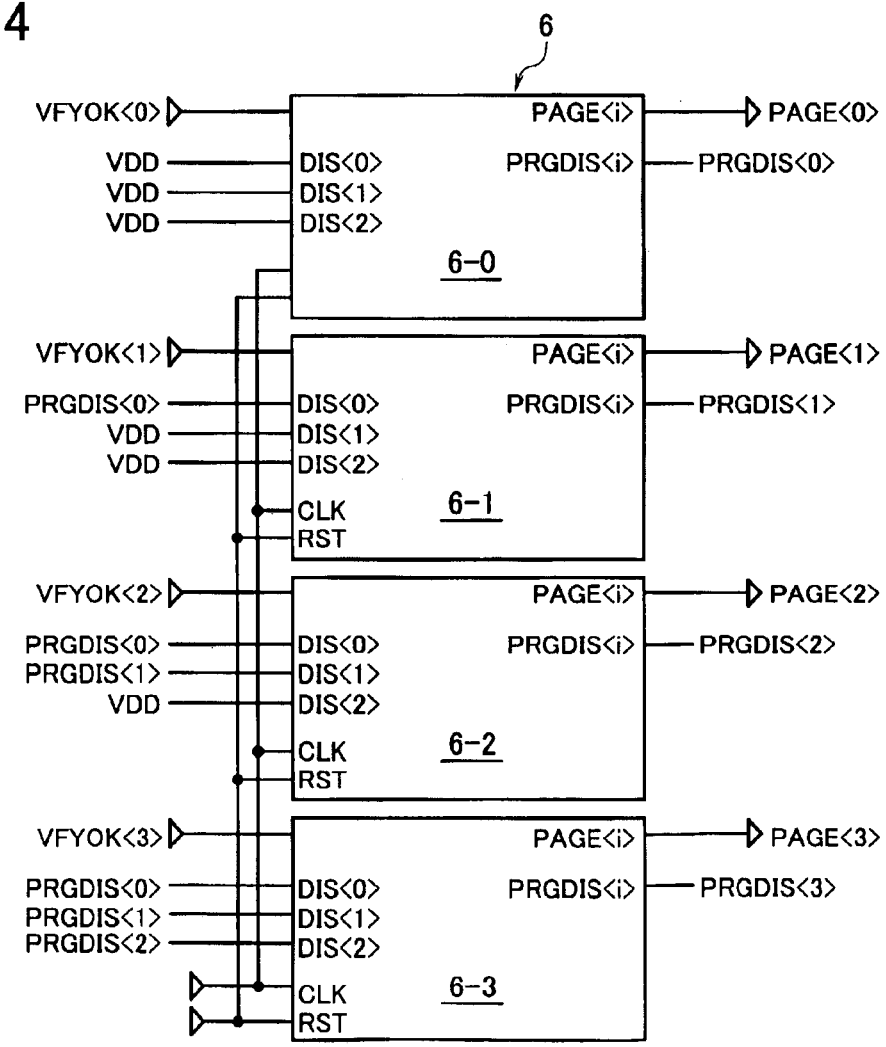
FIG. 4 is a diagram showing a configuration of an address control circuit of the flash memory.

Turning to FIG. 4, there is shown an exemplary configuration of the address control circuit 6 of FIG. 1. This address control circuit 6 is made up of four separate address control units 6-1 through 6-4. During page programming, these address controllers 6-1 to 6-4 are responsive to receipt of a clock signal CLK for sequentially outputting address signals PAGE<0> to PAGE<3>, which are used for access to four addresses (addresses Nos. 1 to 3) within one page. Very importantly, one principal feature of this embodiment is that the address controllers 6-0 to 6-3 are designed so that each is controlled by the verify check output signal VFYOK as output from the data control circuit 5 to skip more than one address that passed the verify test.

Figure 5:
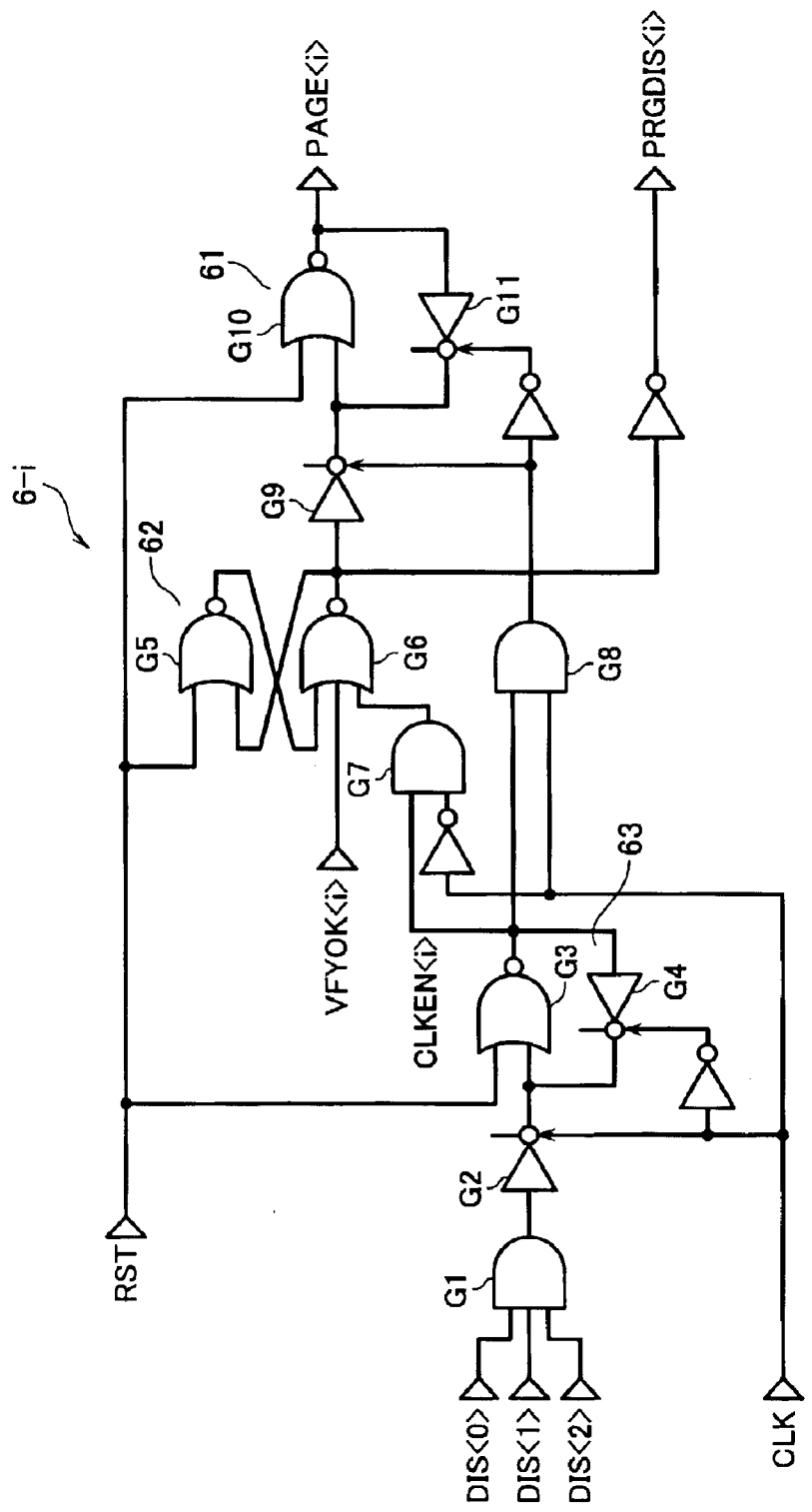
FIG. 5 is a diagram showing a configuration of one address control unit of the address control circuit.

FIG. 5 shows a practically implemented configuration of an address control unit 6-i which is designed to enable achievement of the "address skip" feature. The address controller 6-i includes an address latch 61. This latch 61 is operatively responsive to receipt of a reset signal RST, for setting an address signal PAGE<i> in a non-select state (="L" level). Address latch 61 is also responsive to receipt of a clock signal CLK for sequentially setting an address signal PAGE<i> in a select state (="H"). Latch 61 is made up of a NOR gate G10 and a clocked inverter G11.

The address control unit 6-i also includes a flip-flop circuit 62 of the NOR type. This NOR-flipflop circuit 62 is operable in a way synchronous with the address signal PAGE<i> to output a control signal PRGDIS<i> for sequential activation of a control unit at the next address. More specifically as better shown in FIG. 4, address controllers 6-1 to 6-3 are sequentially linked together to adequately control the transmission of control signals PRGDIS<0> to PRGDIS<2> in a way which follows. A control signal PRGDIS<0> which is output from the address control unit 6-0 for address No. 0 use is sent toward activation terminals DIS<0> of address controllers 6-1 to 6-3 used for addresses #1 to #3. A control signal PRGDIS<1> that is output from the address controller 6-1 for address #1 use is sent to activation nodes DIS<1> of address controllers 6-2 and 6-3 for addresses #2 and #3. A control signal PRGDIS<2> as output from the address controller 6-2 for address #2 is sent to an activation node DIS<2> of address controller 6-3 for address #3.

Every address control unit 6-i is arranged to have three separate activation nodes DIS<0>, DIS<1> and DIS<2>. This is because it is effective and advantageous to make these circuits identical in configuration in a view point of manufacture or mass production. Then, let VDD be input to the activation nodes DIS<0> to DIS<2> of address controller 6-0 for address #0 use, thereby causing it to stay in a "clock enable" state in any events. Similarly the address controller 6-1 for address #1 has two activation nodes for input of VDD; the controller 6-2 for address #2 has a single activation node to which VDD is input.

The activation nodes DIS<0> to DIS<2> stated above are connected to three input terminals of the AND gate G1 respectively as shown in FIG. 5. When these nodes are all at "H" level, the clock signal CLK is sent via the clocked inverter G2 to the clock enable circuit 63, for activation of this enabler 63. Clock enabler 63 is generally made up of a NOR gate G3 and a clocked inverter G4. NOR gate G3 has inputs one of which is for receipt of a reset signal RST and the other of which receives an output signal of AND gate G1 via clocked inverter G2. The latter signal is an inverted version of the output signal of AND gate G1.

More specifically, the clock enabler circuit 63 is reset in response to receipt of the reset signal RST. Clock enabler 63 outputs an enable signal CLKEN<i> with "H" level (CLKEN<i>="H") when all the activation nodes DIS<0> to DIS<2> are potentially at "H" level and at the same time the clock CLK is at "H." When AND gates G7 and G8 are made active by this clock enable signal CLKEN<i>, the clock CLK is allowed to be transferred to the flip-flop 62 and address latch 61.

Note that the NOR gate G6 of flipflop 62 is provided with a specific input terminal as an important element for the purpose of skipping an address that passed its write-verify check within one page. This specific input node is for receipt of a verify check signal VFYOK<i> to be output from the data control circuit 5 along with the clock CLK. With such an arrangement, for an address with the verify check signal VFYOK<i> being set at "H" level (VFYOK<i>="H"), the output signal of flipflop 62 is potentially fixed at "L" level irrespective of whether the clock signal CLK is input or not, resulting in output of a control signal PRGDIS<i> with "H" level (PRGDIS<i>="H"). In addition, the address latch 61 also is arranged to output the nonselect state (PAGE<i>= "L") without regard to input of the clock CLK.

With such an arrangement, the intended address skipping is performed in a way which follows. For example, assume that the address #2 is flagged with "Pass" as a result of verify check. In this case the control unit 6-2 retains therein the state of PAGE<2>="L" and PRGDIS<2>="H." After the controller 6-1 for address #1 use outputs PAGE<1>="H," the controller 6-3 for address #3 outputs an address signal PAGE<3>="H" upon receipt of the next clock.

A detailed explanation will be given of an operation of the address control circuit 6 during page programming with reference to the timing diagrams of FIGS. 7 and 8 below.

Figure 7:
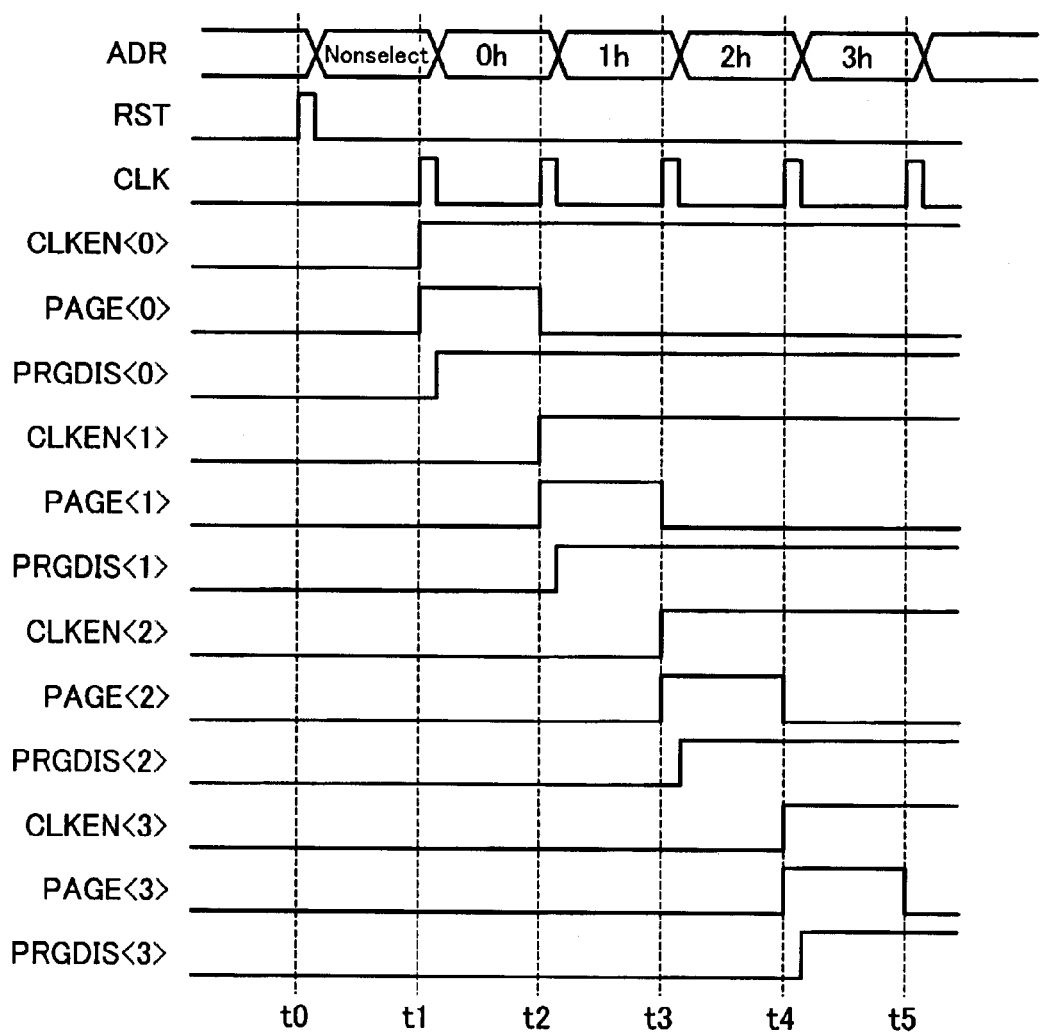
FIG. 7 is a diagram showing timings of a basic operation for address selection of the page programming.

FIG. 7 is a timing chart in the state that no addresses within a page pass the verify test—in other words, in the event that all of the verify check signals VFYOK<0> to VFYOK<3> are at "L" level. In this case, addresses within the page are simply selected one by one sequentially. Firstly, when a reset pulse RST potentially goes high to reach "H" level at time point t0, the address latch 61 is reset in every address control unit 6-i. This results in establishment of an all nonselect state with the address signals PAGE<0> to PAGE<3> being set at "L" level (PAGE<0:3>="L").

At this time simultaneously, the flip-flop 62 in every address control unit 6-i is set causing the control signals PRGDIS<0> to PRGDIS<3> to be at "L" level (PRGDIS<0:3>="L"). The individual one of these signals is an activation signal for determining which one of a write or a verify operation is executed at each address, and is input to an address control unit of an address subsequent to the address in the way stated supra.

A clock signal CLK for address setup is the one that has pulses to be generated in address setup events as shown in FIG. 7. When the first clock CLK becomes at "H" level at time point t1, the clock enable signal CLKEN<0> potentially goes high in the address control unit 6-0 corresponding to address No. 0. In responding thereto, the address latch 61 outputs an address signal PAGE<0> with "H" level (PAGE<0>="H"). That is, select address #0. When the clock CLK potentially goes low, the flip-flop 62 is reset, resulting in output of a control signal PRGDIS<0> with "H" level (PRGDIS<0>="H") which indicates that the address #0 has already been selected. During this operation of address control unit 6-0, the other address control units 6-1 to 6-3 for addresses #1 to #3 are such that their clock enable circuits 63 retain CLKEN<1> to <3> of "L" level and are set in the nonselect state.

The control signal PRGDIS<0>="H" that is output from the address control unit 6-0 is input to the activation nodes of the address control units 6-1 to 6-3, causing the address control unit 6-1 of address #1 to be set in a clock enable state. Accordingly, when the clock CLK goes next high in potential to reach "H" level at time point t2, the clock enable signal CLKEN<1> becomes "H" level in the address control unit 6-1 for address #1. In responding thereto, the address latch 61 outputs an address signal PAGE<1>="H." This is to select address #1. When the clock CLK potentially goes low to have "L" level, the flip-flop 62 is reset resulting in output of a control signal PRGDIS<1>="H," which indicates that the selection of address #1 has been completed. Thereafter, similar operations are repeated whereby the clock CLK becomes to have "H" level at time points t3 and t4 so that addresses #2 and #3 are selected sequentially.

Figure 8:
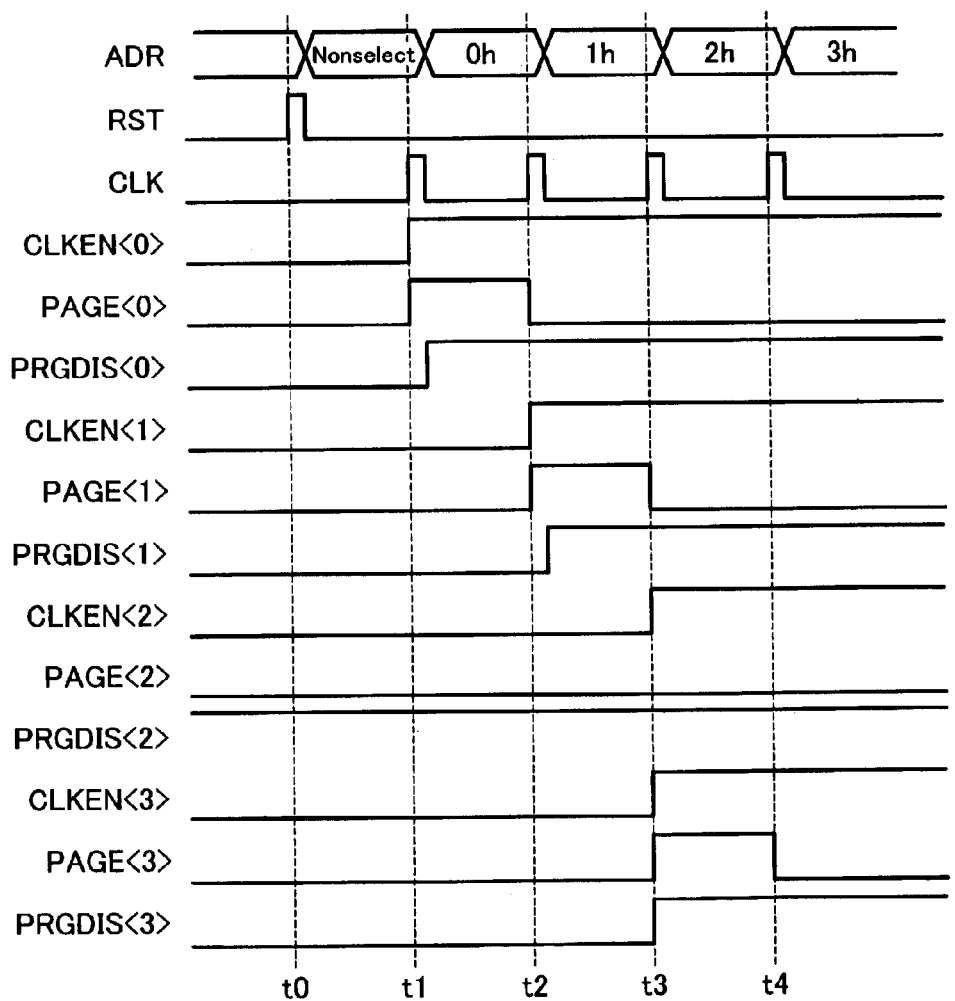
FIG. 8 is a timing diagram of an operation in case an address skip event occurs in the page program.

See next FIG. 8. This is a timing diagram for those cases where the address #2 has already been flagged with "Pass" as the result of a verify-check process. At this time the address control unit 6-2 for address #2 is such that its flipflop 62 is set due to VFYOK<2>="H." Thus, it retains an address signal PAGE<2>="H" and a control signal PRGDIS<2>="H" without regard to the clock CLK.

When the reset pulse RST potentially goes high and is at "H" level at time point t0, address latches 61 are reset in all the address control units 6-0 to 6-3. This results in establishment of an all nonselect state with address signals PAGE<0> to PAGE<3> having "L" level (PAGE<0:3>="L"). Thereafter, address signals PAGE<0> and PAGE<1> sequentially become at "H" level in response to the clock CLK, and then the control signals PRGDIS<0> and <1> are set at "H" level in a similar way to the case of FIG. 7.

As the control signal PRGDIS<2> has already been set at "H" level in response to the potential level transition of verify check signal VFYOK<2> to "H" level (VFYOK<2>="H") when the clock CLK is at "H" level at time t3, both the clock enable signal CLKEN<2> of address control unit 6-2 and the clock enable signal CLKEN<3> of address control unit 6-3 potentially go high simultaneously. Whereby, the address control unit 6-3 is activated to output an address signal PAGE<3> with "H" level (PAGE<3>="H"). This results in selection of the address #3 while letting the address #2 be skipped with the address signal PAGE<2> staying at "L" level (PAGE<2>="L") in the absence of any timing delays.

The above-stated address control procedure is executed with respect to each of the write and verify processes, thereby making it possible to achieve the page programming sequence shown in the flow diagram of FIG. 7.

With the use of the array configuration such as shown in FIG. 2 while assigning an intra-page address (low address of a column) to one of those column gates that are organized into the tree structure, it becomes possible to perform writing or programming at high speeds. This can be said because the page programming scheme with the process flow of FIG. 7 offers the capability to share the setup time for word-line transition on a per-page basis. Furthermore, even in cases where verify check results indicate "Fail" again and again at a specific address, skip the address that once passed the verify test and is flagged with "Pass" while preventing any further execution of write/verify-read operations for the passed address. Thus, an entire write time will hardly increase in length even where writing is slow at the specific address. This in turn makes it possible to perform the intended page programming within a shortened length of time period.

It has been stated that the page program scheme of this embodiment is specifically arranged to skip the write verify passed address—namely, the address that already passed the write-verify check test and thus is presently flagged with "Pass." On the other hand, in case write data bits of a given address are all logic "1"s (all ones state), any further write/verify operations are no longer required. In other words, no write/verify is needed for the address with no "0" write bits. Thus, skipping such address is preferable for speeding up the page programming. One approach to doing this is to input an AND output of write data bits in place of the verify check signal VFYOK<i> in the address control circuit 6.

Figure 9:
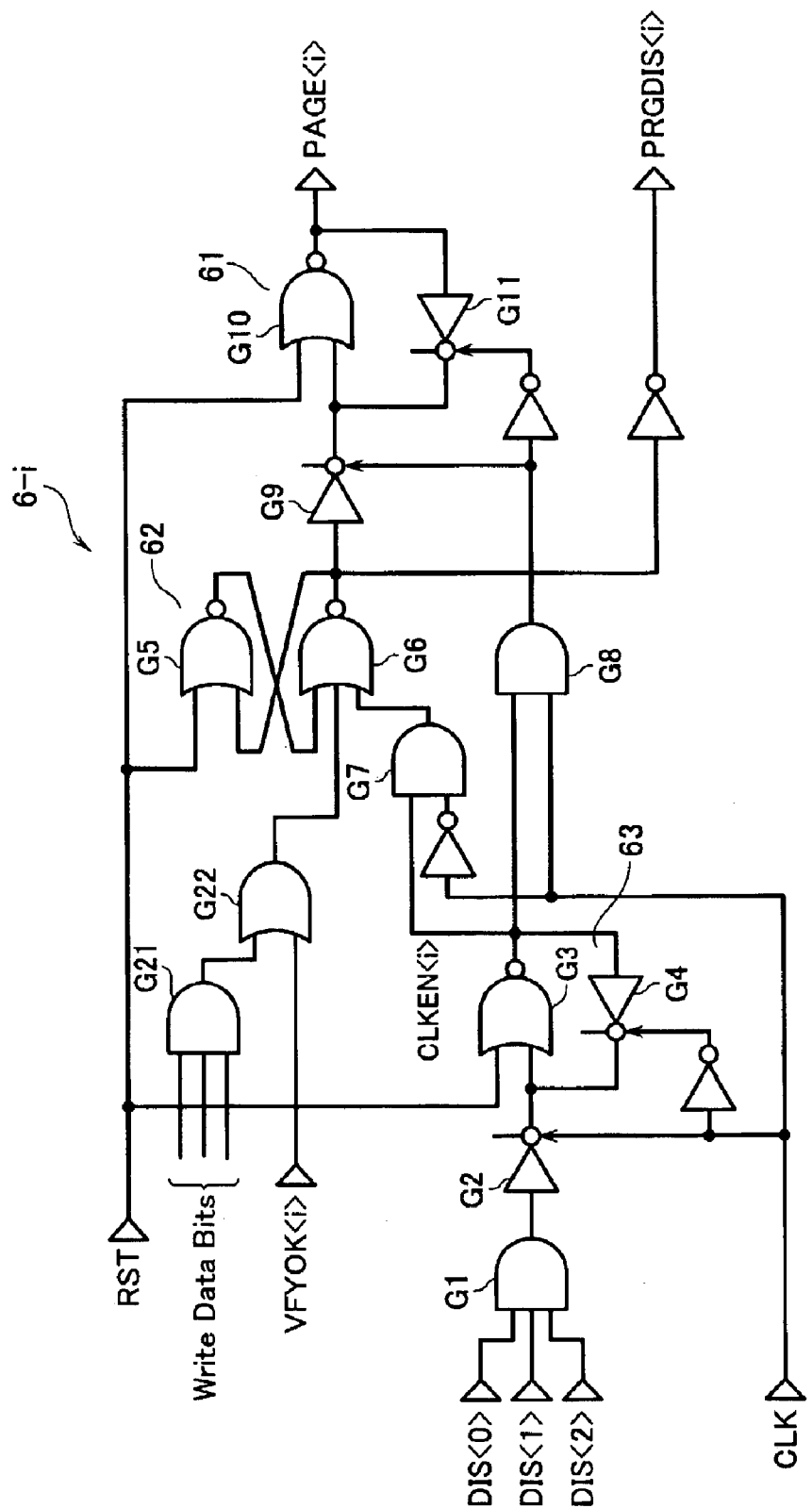
FIG. 9 is a diagram showing another configuration of the address control unit.

An alternative, more preferable approach to obtaining similar results is to skip an address with no "0" write bits also, in addition to skipping the address that is presently flagged with "Pass" as a result of write-verify check. A configuration of an address control unit 6-i which employs this approach is shown in FIG. 9 in a way corresponding to FIG. 5. This address controller 6-i shown herein is different from that of FIG. 5 in that the former further includes a multiple-input AND gate G21 and its associative two-input OR gate G22. The AND gate G21 receives write data bits for detecting that these data bits are all logic "1"s (all ones). OR gate G22 is responsive to receipt of an output signal of AND gate G21 and also a verify check output signal VFYOK<i>, for generating an ORed output signal, which is sent to a corresponding input of the NOR gate G6 of flipflop circuit 62. With such an arrangement, it becomes possible to further enhance the high-speed performance of the page programming.

An explanation will next be given of an erase sequence in the NOR-flash memory of this embodiment. Typically, data erasing is such that bulk erase, also known as "all-at-a-time" or "all-at-once" erase, is done in units of erase blocks. The data erase sequence includes two subsequences, one of which is for writing prior to erasing, and the other of which is for reducing a distribution of threshold voltages of erased cells. The "prior-to-erase write" subsequence (for simplicity the "before-erase write" subsequence) is for presetting all of the data bits within a memory cell block to be erased in an all "0" (all zeros) state prior to execution of an erase operation. The "erase-cell threshold voltage distribution reduction" subsequence comes after completion of an erase, for reducing the width of a threshold voltage distribution of "0" data. In these subsequences, it becomes effective to perform address skip similar to that in the page programming stated supra.

Figure 10:
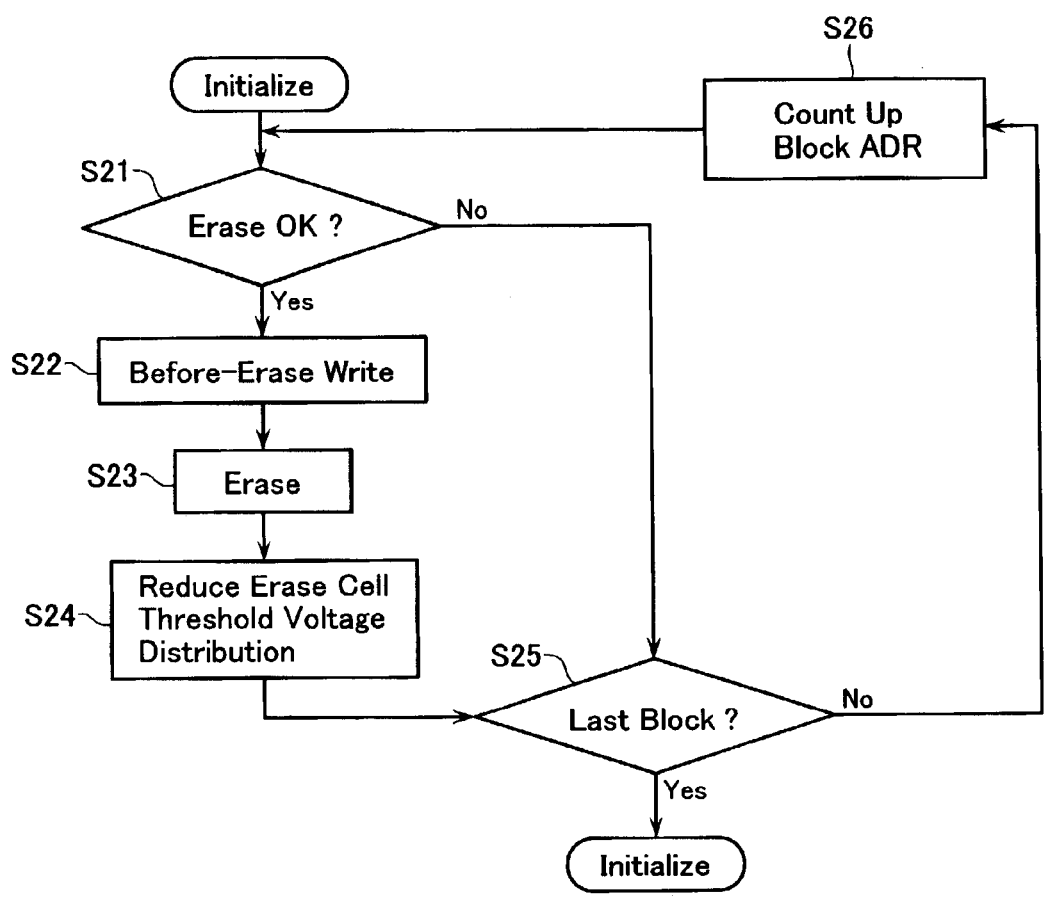
FIG. 10 is a diagram showing the flow of a block erase procedure of the embodiment.

FIG. 10 shows a process flow of the erase sequence also embodying the invention. After initialization, the erase routine starts with step S21 which receives and accepts an erase command and then makes sure the execution of an erase operation. If YES at step S21, then the routine goes to step S22 which is the "before-erase write" subsequence discussed above. At step S22, force all of the memory cells within a block—this block stores therein a mixture of logic "0" and "1" data bits—to be set in the write state (i.e. "0" data storage state). After having set all the intra-block cell data bits in an all "0" state, the routine proceeds to step S23 which performs bulk erase of the block, that is, erase all the cells in this block concurrently. Then, go to step S24 which executes a "weak" write subsequence for reducing or narrowing the width of a distribution of threshold voltages of such erased cells within the block. At step S25, determine whether the erased block is a final block. In case a plurality of blocks are to be erased, a need is felt to erase another block. If NO at step S25, that is, when there is any further block to be erased, then go to step S26 which performs updating of the block address and return to step S21. The erase sequence above will be cycled until a present block is found to be the final block at step S25.

Figure 11:
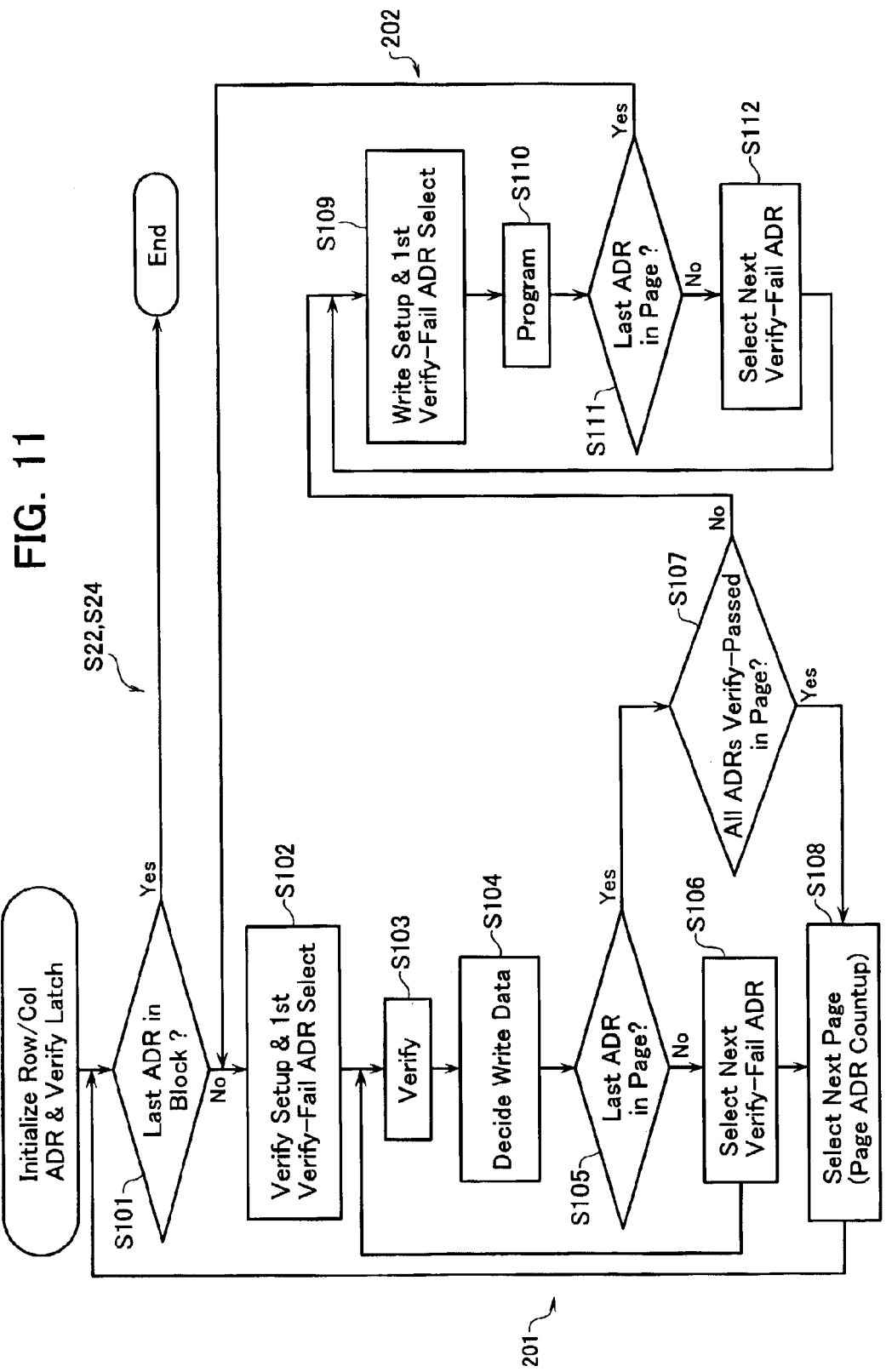
FIG. 11 is a diagram showing a subsequence of the block erase procedure, which is for before-erase write and erase cell threshold voltage distribution reduction write.
Figure 12:
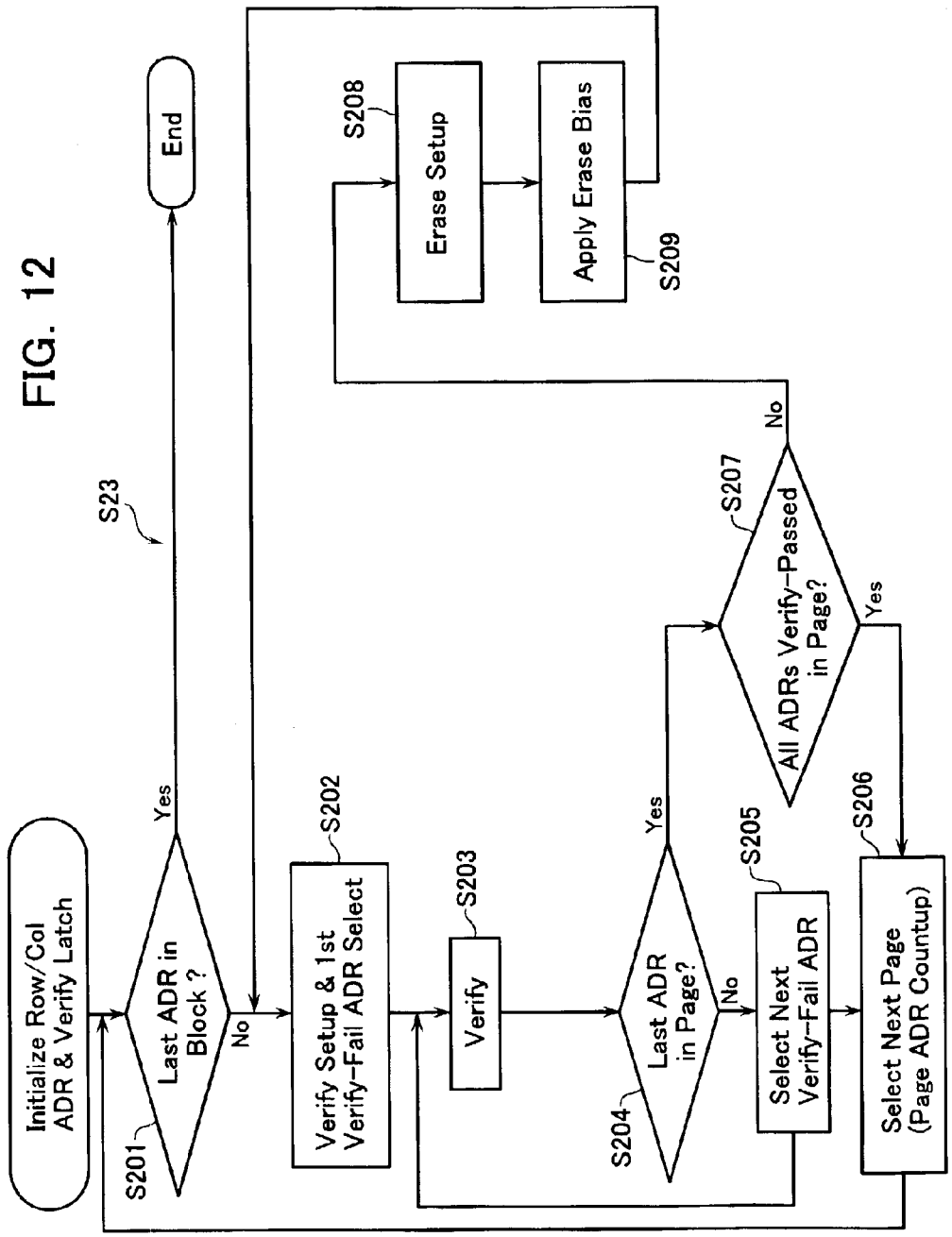
FIG. 12 is a diagram showing an erase sequence of the block erase.

FIG. 11 shows a process flow of the before-erase write subsequence S22 and the erase-cell threshold voltage distribution reduction subsequence S24 shown in FIG. 10. FIG. 12 shows a flow of the erase subsequence S23 in FIG. 10. These subsequences will be set forth in detail below.

As shown in FIG. 11, in the before-erase write subsequence, a verify-read sequence loop 201 is first executed; thereafter, a "0" write sequence loop 202 is done in case verify-read check tests for all the addresses result in failure to indicate "Pass"—namely, when at least one failed address is found therein. More specifically, after completion of row/column address initialization and verify latch initialization, ascertain the final address within a memory cell block at step S101. At step S102, perform verify setup and selection of a first address with its verify check result indicating "Fail." In step S103, perform a very-read operation. In step S104, determine write data in order to write a logic "0" data bit into the cell that is confirmed to presently store therein logic "1" data as the result of this verify-read. Then at step S105, determine whether the present address is the final address within the block of interest. If NO at step S105, that is, when the present address is not the final address, then go to step S106 which identifies and selects the next verify failed address flagged with "Fail." Next, return at step S103 for repeated execution of a similar verify-read operation(s).

When the final address is confirmed at step S105, the system routine of FIG. 11 branches to step S107 which determines whether all of the intra-page addresses are of logic "0"s (all zeros state). In case a logic "1" data bit is found, the answer NO is issued at step S107. If this is the case, the routine shifts to the before-erase write subsequence 202. This subsequence starts with step S109 which performs write setup and also selects a first failed address with its verify result indicating "Fail." Then, proceed to step S101 which performs "0" write. Next, at step S111, determine whether a present address is the final address within the page. If NO at step S111 then go to step S112 which selects the next failed address flagged with "Fail." Thereafter, a similar write operation will be recurrently performed until a present address is decided as the final address in the page at step S111. When it is made sure at step S111 that writing was done up to the final intra-page address, i.e. if YES at this step, then return to the verify-read sequence loop 201. Thereafter, a similar operation will be cycled until all the memory cells at all addresses in the block are set in the logic "0" storage state (all zeros state), while updating the page address at step S108.

It is apparent from the foregoing discussion that in the before-erase write subsequence also, high-speed performance is achievable by skipping the already "verify-passed" address or addresses in a similar way to that in the page programming procedure stated previously.

An explanation will be given of a per-block erase operation. This block erase is such that an erase bias voltage is applied to all the memory cells within a selected block to thereby erase them concurrently. A practically implemented procedure of the subsequence S23 for this per-block erase is shown in FIG. 12. As shown herein, after completion of row/column address initialization and verify-latch initialization, the subsequence S23 starts with step S201 which determines if a present address is the final one within the block. If YES at step S201, subsequence S23 is terminated. If NO at step S201 then go to step S202 which performs verify setup and selection of a first failed address with its verify result indicating "Fail," followed by step S203 which performs an erase-verify-read operation on a per-address basis. Then, proceed to step S204 which determines if a present address is the final address within the page. If NO at step S204, go to step S205 which identifies and selects the next failed address flagged with "Fail." After the selection, return to step S203 for repeated execution of the erase-verify-read operation in a similar way. When a present address is the final one in the block, YES is issued at step S204. This means that all the addresses in the page have completed the verify-read. If this is the case, the routine branches to step S207 which determines whether all the addresses within the page are with "Pass" in verify check results. If NO at step S207, that is, when all the intrapage addresses are not flagged with "Pass," in other words, when these are not in the all ones state, the routine goes to step S208 which performs erase setup. Then, at step S209, apply the erase bias to thereby perform the block erase required. This operation will be cycled while performing sequential page selection at step S206. This operation cycle will be executed until the erase state with all zeros is ascertained within the block.

A detailed explanation will next be given of the erase-cell threshold voltage distribution reduction subsequence S24. In the case of NOR flash EEPROM chips, over-erase can sometimes occur among memory cells. Overerase may be defined as letting a cell excessively decrease in threshold voltage. When an overerased cell is found, this cell permits unwanted flow of a cell current even when it is not selected—i.e., in the nonselect state. This current flow can often cause read failure, also known as erroneous read. The erase-cell threshold voltage distribution reduction subsequence S24 is the one that performs "weak" write with respect to such overerased cell with its threshold voltage lowered excessively. A process flow therefor is principally similar to that of the before-erase write subsequence 202 shown in FIG. 11.

Figure 13:
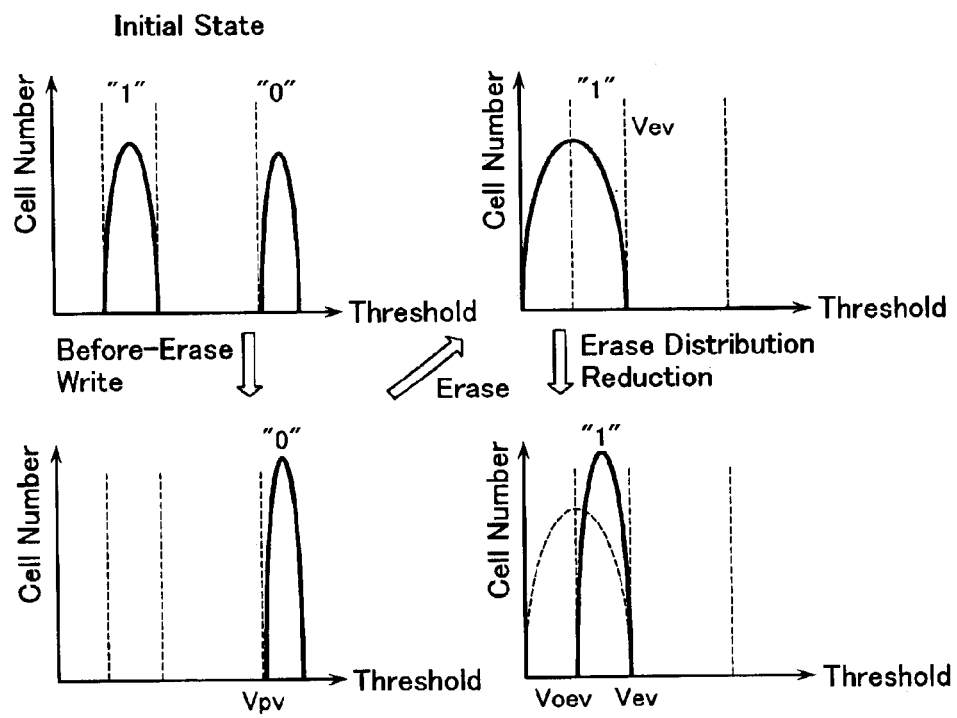
FIG. 13 is a diagram showing threshold value changes due to the before-erase write and the erase cell threshold voltage distribution reduction write.

FIG. 13 graphically shows a transition pattern of the memory cell threshold voltage distribution owing to an erase sequence using the erase-cell threshold voltage distribution reduction subsequence (weak write subsequence). As previously stated, execution of the before-erase write subsequence results in the initial state with a mixture of logic "0" and "1" data bits (zeros and ones) being changed to a state that the threshold voltages of all the memory cells within the block are in a write state (logic "0" data state). In FIG. 13, Vpv indicates a write-verify voltage. In the erase subsequence, erase all memory cells in the block concurrently (bulk erase) to thereby establish an all ones state. Vev is an erase-verify voltage. Lastly, in the write subsequence for overerased cells, perform weak write with respect to those memory cells which are presently set in an overerase state, thereby to guarantee a lower limit level Voev of the memory cell threshold voltage.

For such the overerase cell write subsequence also, the same sequence as that of the before-erase write is employable. In order to suppress the write amount to less than that during the before-erase write subsequence, only the wordline bias voltage is set in many cases lower than that during standard or "normal" writing. An example is that while the wordline bias voltage is 10V during normal writing, a voltage of 3 to 5 volts is applied to a word line during overerase cell writing.

In the overerase cell write session, the threshold voltages must not be varied to go beyond the erase-verify voltage Vev due to over-writing or "over-programming." One approach to attain this is to perform a "step-up" write operation in some cases. This step-up write is a process for writing data at the same address for several times while potentially increasing a wordline voltage during writing in steps rather than continuously, once at a time whenever write is done.

Figure 14:
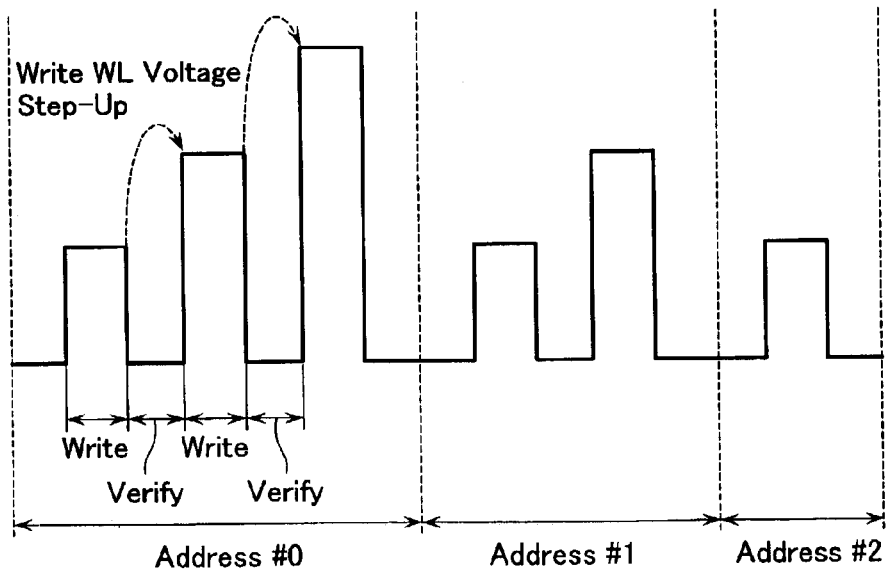
FIG. 14 is a diagram for explanation of a "step-up" write scheme.

FIG. 14 a waveform diagram showing a stair step-like level transition pattern of a wordline (WL) voltage source which is designed to perform the step-up writing stated above. At each address, verify and write (overerase cell write) operations are repeated. When a first verify results in "Fail," lower the WL level during writing (for example, set at 3V). Thereafter, every time a verify test is failed at the same address, let the WL voltage to be applied during the next writing increase in a step-up fashion—for example, set it at 3.5V during second writing, and at 4.0V during third writing.

In the step-up write session for forcing the wordline voltage level to frequently transit in the way stated above, the page write scheme of this invention is extremely effective. This can be said because this scheme is capable of reducing in number the wordline voltage setup processes by performing address updating during each write operation and also during each verify operation.

Figure 15:
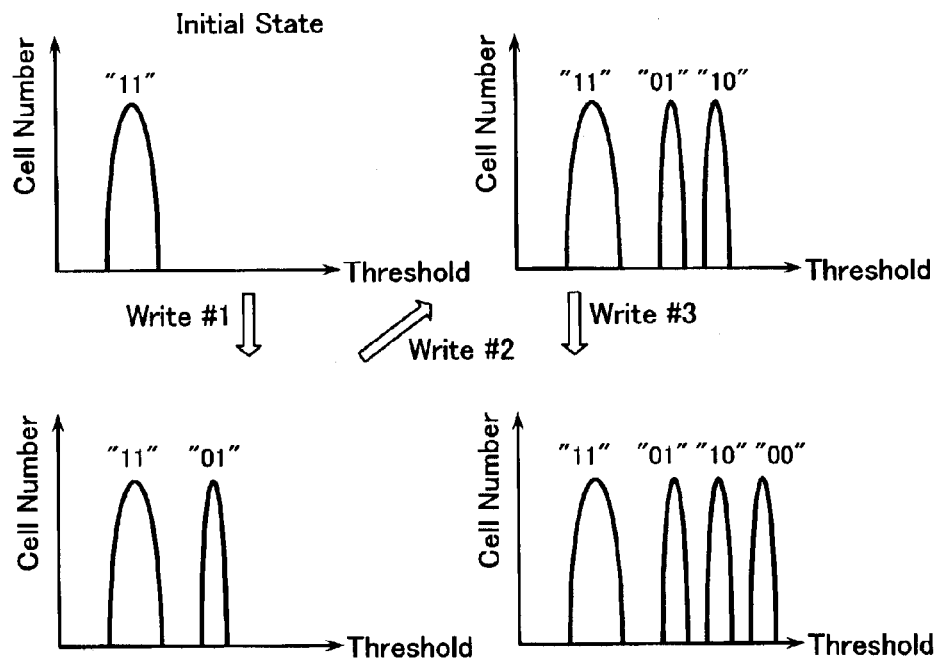
FIG. 15 is a diagram for explanation of a write scheme in the case of four-value storage.

The stepup write scheme stated above is applicable not only to the weak write sequence for overerased memory cells but also to the normal write and before-erase write sequences stated previously. Also note that the stepup write is also effectively applicable to multiple-value storable semiconductor memory devices with capabilities to store more than two bits of data per memory cell. As shown in FIG. 15, a multi-value memory write operation in NOR flash memory chips is done in such a way that data bits are written one by one in the order of sequence that data with a lower threshold voltage precedes the others. Although the correspondence between the threshold voltages and the multi-value data is available in various ways, suppose here that four values of "11," "01," "10" and "00" are assigned to the threshold voltages as follows: the value "11" is assigned to the lowest threshold voltage; "01" is to the second lowest threshold voltage; "10" is to the third lowest threshold voltage; and, "00" is to the highest threshold voltage.

In this case, as shown in FIG. 15, the initial state is an erase state which is low in threshold voltage (data "11"). Its following subsequence for "01" writing is a write operation No. 1. The next subsequence for "10" write is a write operation #2. The next sequence for "00" write is a write #3. Using the page programming scheme shown in FIG. 6 for a respective one of these writes #1 to #3, it is possible to shorten the length of a write time period by sharing the number of write-use power supply voltage level transitions on a per-page basis.

Multivalue information storage and write methods come with a wide variety of options. One option is whether multivalue information is allocated to I/O or address. Another option is whether "10" and "00" also are written up to the "01" level during "01" writing. However, the writing with the same wordline voltage is such that the page program scheme which writes data bits to a plurality of addresses concurrently while performing column gate switching and then performs verify therefor is applicable in any cases.

It has been stated that according to this invention, a nonvolatile semiconductor memory device is obtainable which is capable of writing a page of data bits to a plurality of addresses at increased speeds.

What is claimed is:

1. A nonvolatile semiconductor memory device comprising:
   a cell array with a layout of electrically writable and erasable nonvolatile memory cells;
   a write control circuit configured to write one-page data into said cell array at a plurality of addresses within the page; and
   said write control circuit being operable to repeatedly perform iteration of a write operation for the plurality of addresses corresponding to a page and iteration of a verify-read operation for said plurality of address after writing until verify-read check is passed with respect to all the addresses, and
   as for addresses of cells without data to be written, to skip the write operation and the verify-read operation after writing.

2. The device according to claim 1, wherein the address without a cell to be written is an address which passed the verify-read check during a verify-read operation.

3. The device according to claim 1, wherein said write control circuit also functions in an erase threshold voltage distribution reduction operation for performing weak write to a memory cell in an over-erase state after erasing in an erase sequence which performs erase in units of blocks of said cell array to thereby narrow an erase threshold voltage distribution.

4. The device according to claim 1, wherein said write control circuit performs a plurality of times of write operations with respect to the same address within a page in such a way as to sequentially step up a write voltage pulse being given to a selected word line.

5. The device according to claim 1, wherein said cell array is such that a single memory cell performs multiple value storage of more than two (2) bits.

6. A nonvolatile semiconductor memory device comprising:
- a cell array with a layout of electrically writable and erasable nonvolatile memory cells;
- a sense amplifier connected to the bit line being selected, configured to detect data; and
- a write control circuit configured to perform writing due to supplement of a data voltage to the bit line selected and verify-read due to bit line data transfer to said sense amplifier while applying a drive voltage to the selected word line during writing and also during verify-read after writing,
- wherein said write control circuit includes,
- a data control circuit being operable to store therein one-page write data and to supply the data voltage to a bit line being selected and having a transfer gate configured to control transfer of the data voltage to said bit line in response to an output of said sense amplifier during verify-read, and
- an address control circuit having a function of sequentially generating address signals within a page and being arranged to be controlled by a verify-read check output to sequentially output the address signals within a page while skipping an address needless to be written.

7. The device according to claim 6, wherein said write control circuit also functions during erase-before writing for setting all memory cells of a block to be erased in a write state during an erase sequence for performing erasing in units of blocks of said cell array.

8. The device according to claim 6, wherein said write control circuit also functions in an erase threshold voltage distribution reduction operation for performing weak write to a memory cell in an over-erase state after erasing in an erase sequence which performs erase in units of blocks of said cell array to thereby narrow an erase threshold voltage distribution.

9. The device according to claim 6, wherein said write control circuit performs a plurality of times of write operations with respect to the same address within a page in such a way as to sequentially step up a write voltage pulse being given to a selected word line.

10. The device according to claim 6, wherein said cell array is such that a single memory cell performs multiple value storage of more than two (2) bits.

11. The device according to claim 6, wherein said data control circuit has:
- data latches for one-page data;
- a verify check gate configured to issue an output indicative of a check result by comparison of storage data of each data latch and verify-read data; and
- a transfer gate controlled in activation and inactivation by the output of said verify check gate, for controlling transfer of the storage data of said data latch.

12. The device according to claim 6, wherein said address control circuit includes a number of address control units for sequential output of address signals, said number corresponding to a plurality of addresses within a page, and wherein each said address control unit has:
- an address latch controlled by a clock to output an address signal;
- a flip-flop controlled by a clock and a verify-read check output to output a control signal indicative of address selection; and
- a clock enable circuit configured to control clock input to said address latch and said flip-flop while the control signals of pre-stage units are input respectively to thereby skip address signal output when the verify-read check output is a pass.

13. The device according to claim 12, wherein said flip-flop is controlled by the clock, the verify-read check output and a write data bit, and said clock enable circuit causes the address signal output to skip when said verify-read check output is the pass and when every write data bit is a logic "1."

* * * * *